United States Patent
Kellerman et al.

(10) Patent No.: US 10,030,317 B2
(45) Date of Patent: Jul. 24, 2018

(54) APPARATUS AND METHOD FOR CONTROLLING THICKNESS OF A CRYSTALLINE SHEET GROWN ON A MELT

(71) Applicant: Varian Semiconductor Equipment Associates, Inc., Gloucester, MA (US)

(72) Inventors: Peter L. Kellerman, Essex, MA (US); Frederick M. Carlson, Potsdam, NY (US); David Morrell, Wakefield, MA (US); Brian Mackintosh, Concord, MA (US); Nandish Desai, Waltham, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 749 days.

(21) Appl. No.: 14/517,217

(22) Filed: Oct. 17, 2014

(65) Prior Publication Data

US 2016/0108549 A1 Apr. 21, 2016

(51) Int. Cl.
*C30B 15/06* (2006.01)
*C30B 15/14* (2006.01)
(Continued)

(52) U.S. Cl.
CPC ............ *C30B 15/06* (2013.01); *C30B 11/001* (2013.01); *C30B 11/003* (2013.01);
(Continued)

(58) Field of Classification Search
CPC ... C30B 15/06; C30B 29/64; Y10T 117/1068; Y10T 117/1048; Y10T 117/1044
See application file for complete search history.

(56) References Cited

U.S. PATENT DOCUMENTS 4,289,571 A * 9/1981 Jewett ..................... C30B 15/06
117/212
4,971,652 A * 11/1990 Azad ....................... C30B 15/14
117/15

(Continued)

FOREIGN PATENT DOCUMENTS

CN 103966657 A 8/2014

OTHER PUBLICATIONS

International Search Report and Written Opinion dated Nov. 11, 2015 for corresponding PCT Application PCT/US2015/051709 filed Oct. 17, 2014.

(Continued)

*Primary Examiner* — Matthew Song

(57) ABSTRACT

An apparatus may include a crucible configured to contain the melt, the melt having an exposed surface separated from a floor of the crucible by a first distance, a housing comprising a material that is non-contaminating to the melt, the housing comprising a plurality of sidewalls and a top that are configured to contact the melt, and a plurality of heating elements isolated from the melt and disposed along a transverse direction perpendicular to a pulling direction of the crystalline sheet, the plurality of heating elements being individually powered, wherein the plurality of heating elements are disposed at a second set of distances from the exposed surface of the melt that are less than the first distance, and wherein the plurality of heating elements are configured to vary a heat flux profile along the transverse direction when power is supplied individually to the plurality of heating elements.

17 Claims, 9 Drawing Sheets

(51) Int. Cl.
*C30B 15/22* (2006.01)
*C30B 15/26* (2006.01)
*C30B 29/64* (2006.01)
*C30B 11/00* (2006.01)
*C30B 15/00* (2006.01)
*C30B 29/06* (2006.01)

(52) U.S. Cl.
CPC .......... *C30B 11/006* (2013.01); *C30B 15/002* (2013.01); *C30B 15/14* (2013.01); *C30B 15/22* (2013.01); *C30B 15/26* (2013.01); *C30B 29/06* (2013.01); *C30B 29/64* (2013.01); *Y10T 117/1044* (2015.01); *Y10T 117/1048* (2015.01); *Y10T 117/1068* (2015.01)

(56) References Cited

U.S. PATENT DOCUMENTS

| | | |
|---|---|---|
| 8,475,591 B2 | 7/2013 | Kellerman et al. |
| 2010/0221142 A1* | 9/2010 | Kellerman ............ C30B 11/001 420/555 |
| 2012/0018917 A1* | 1/2012 | Washiyama ............ B29C 33/58 264/175 |
| 2012/0292825 A1 | 11/2012 | Jang et al. |
| 2013/0112135 A1* | 5/2013 | Carlson ................. C30B 15/007 117/73 |
| 2013/0133567 A1 | 5/2013 | Bender |
| 2013/0233237 A1 | 9/2013 | Bender et al. |

OTHER PUBLICATIONS

Frederick M. Carlson, et al., Apparatus for Processing a Melt, U.S. Appl. No. 14/275,770, filed May 12, 2014.

Peter L. Kellerman, Apparatus for Controlling Heat Flow Within a Silicon Melt, U.S. Appl. No. 14/227,006, filed Mar. 27, 2014.

\* cited by examiner

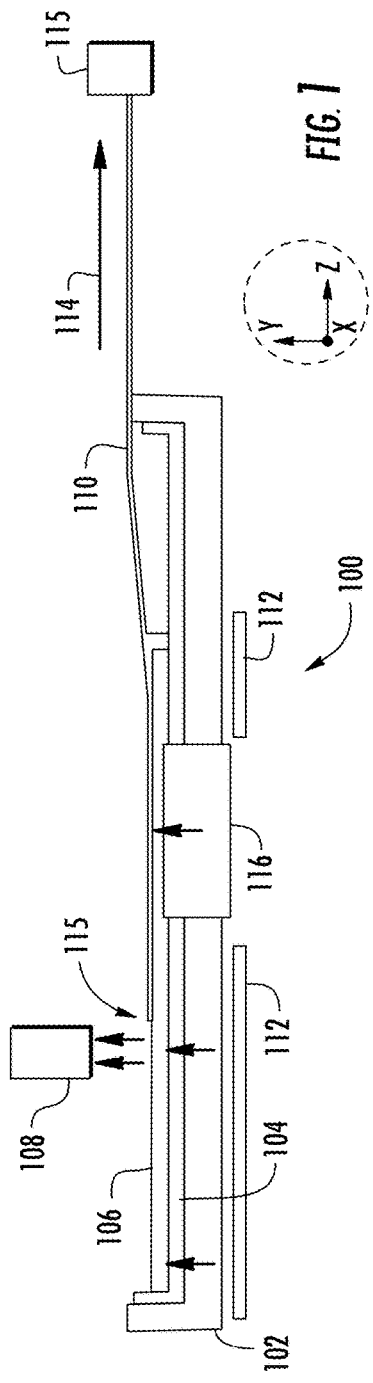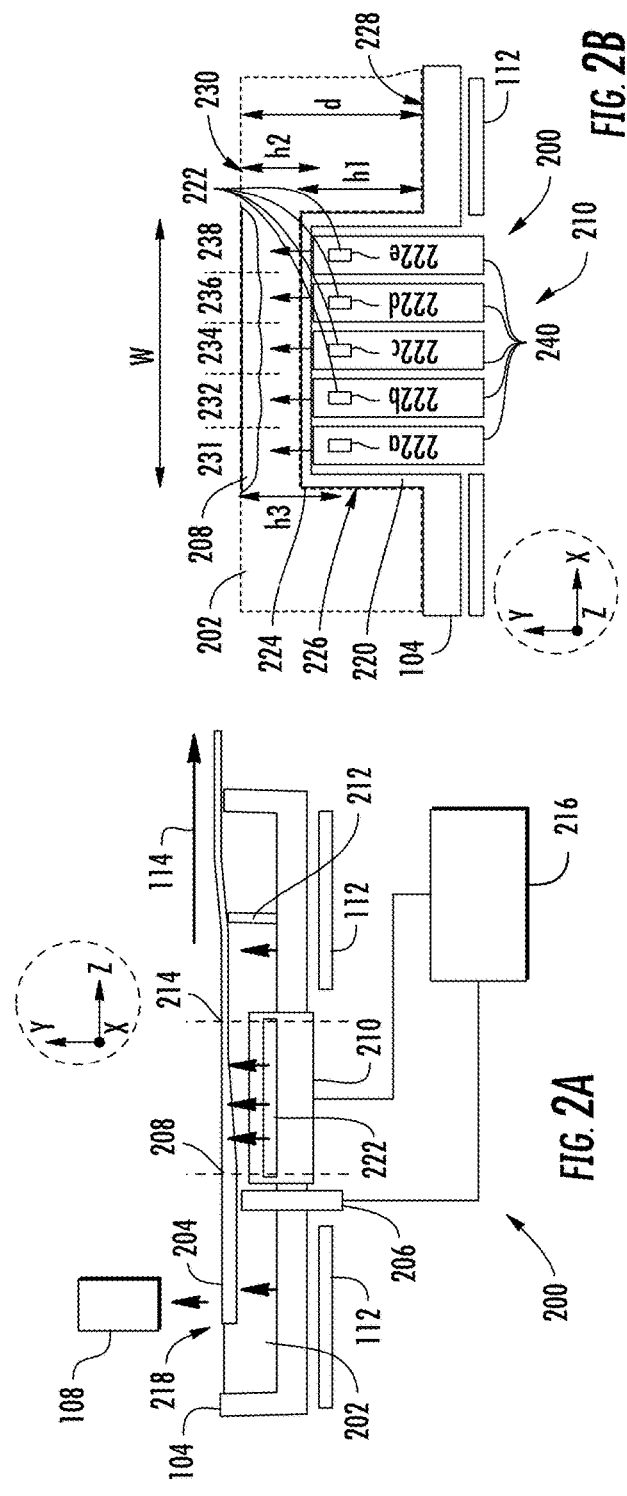

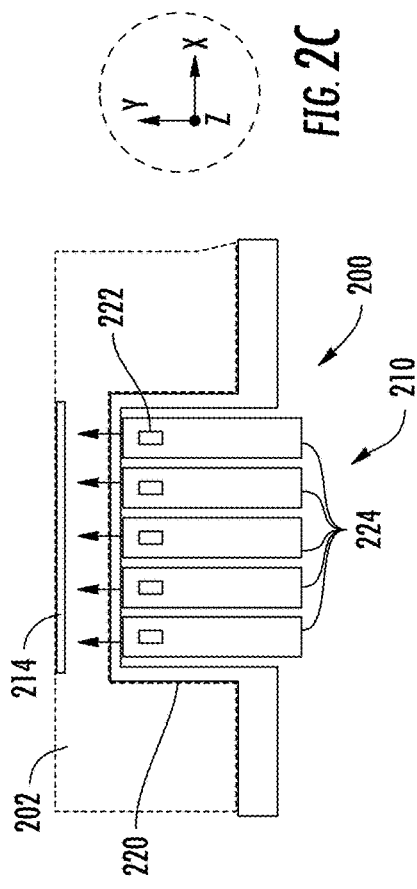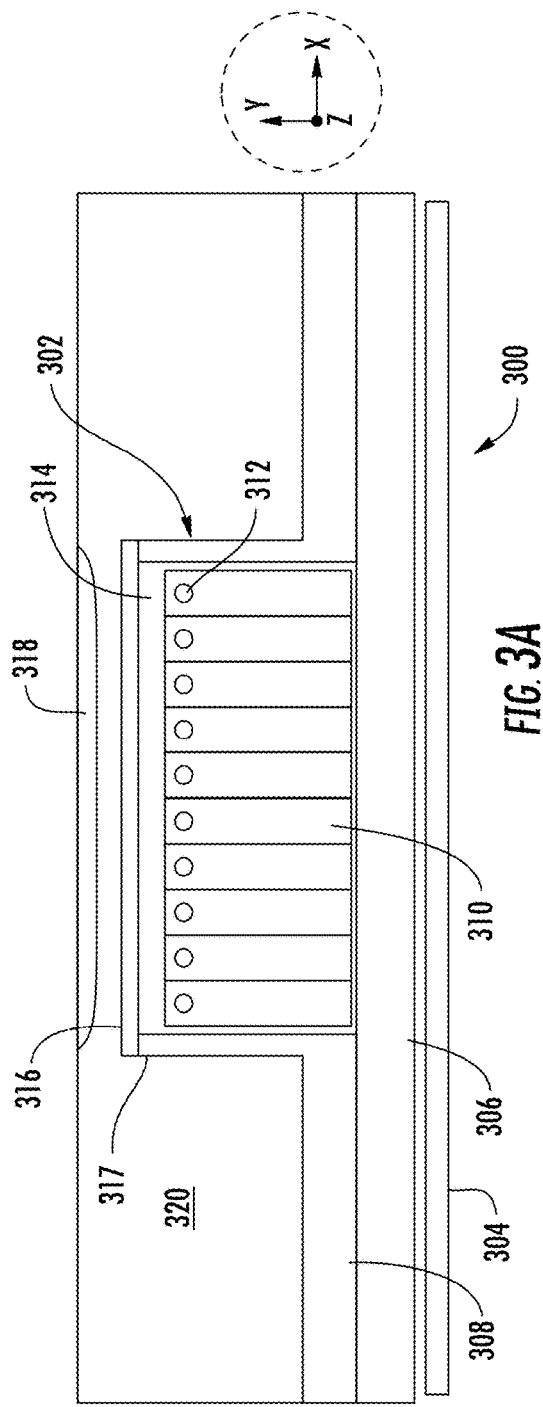

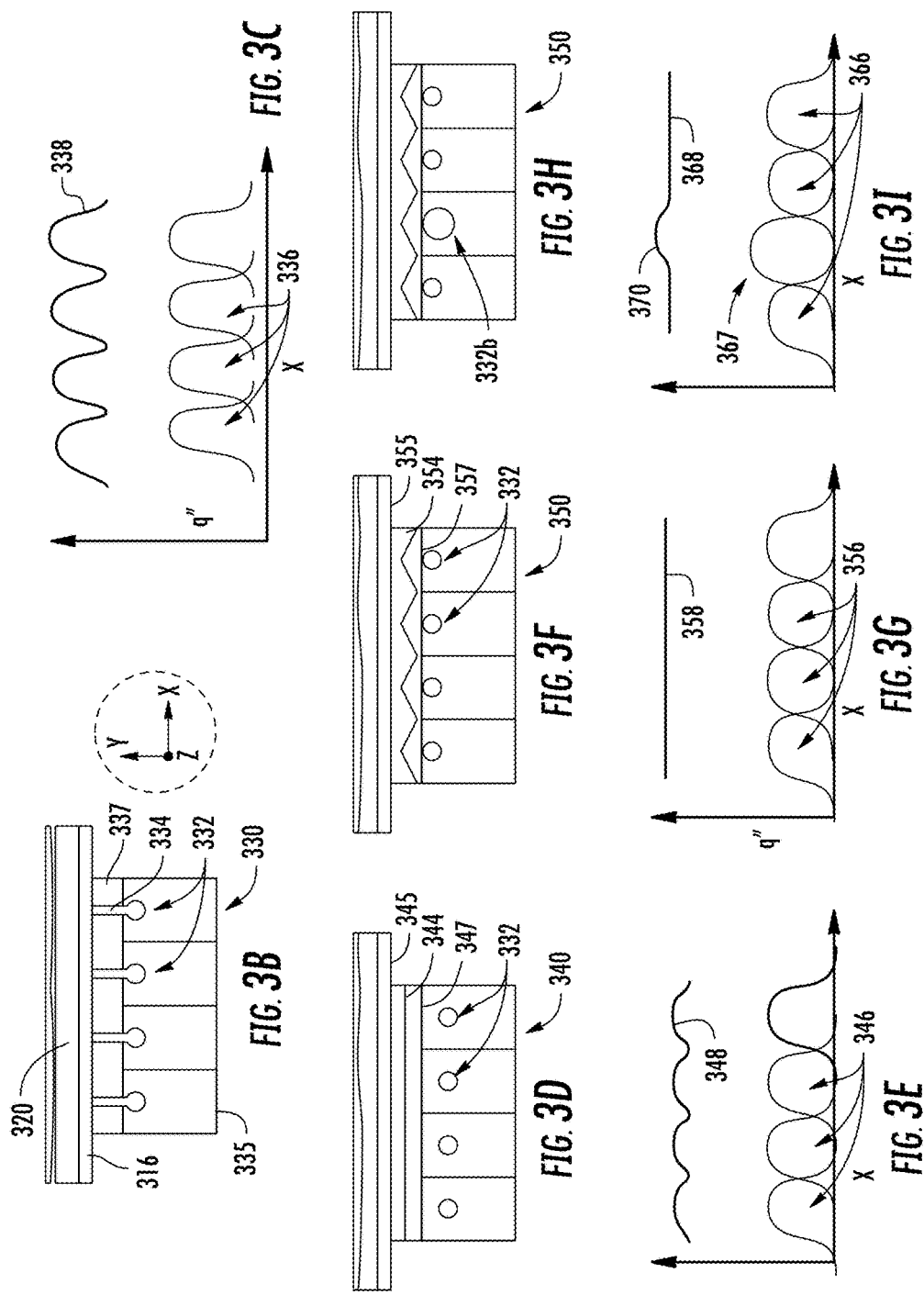

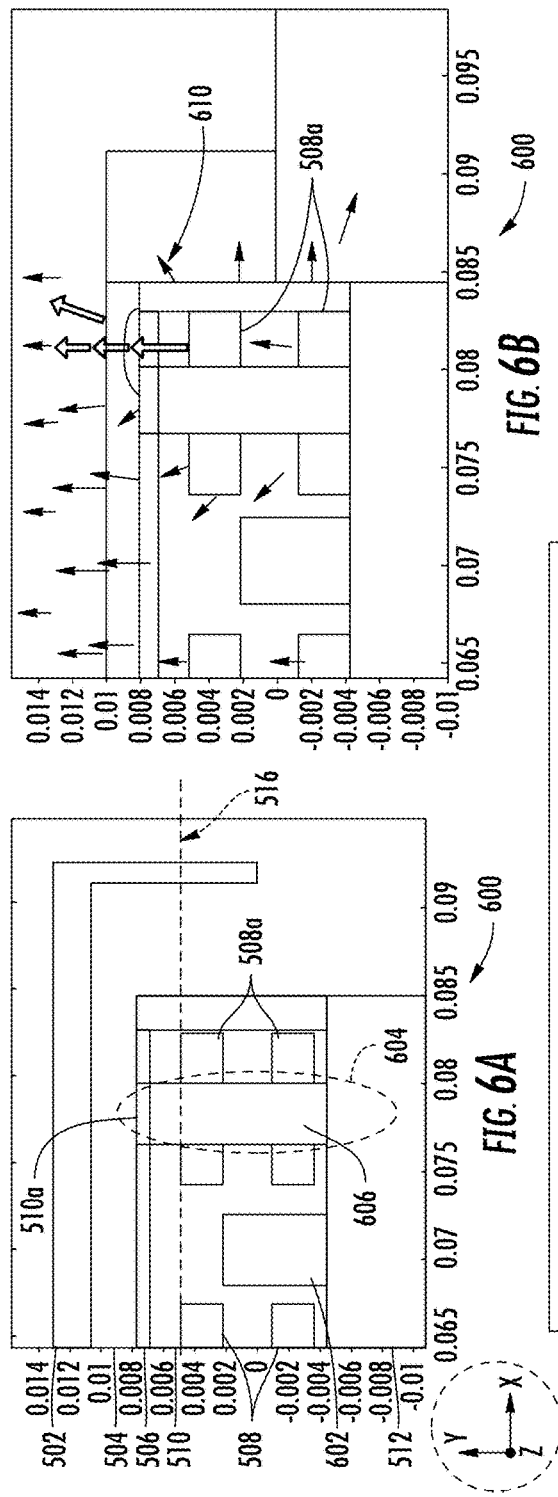
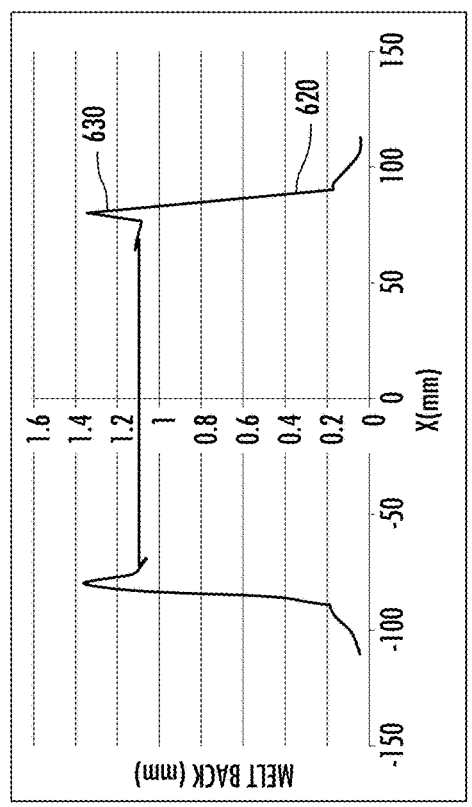
FIG. 6A
FIG. 6B
FIG. 6C

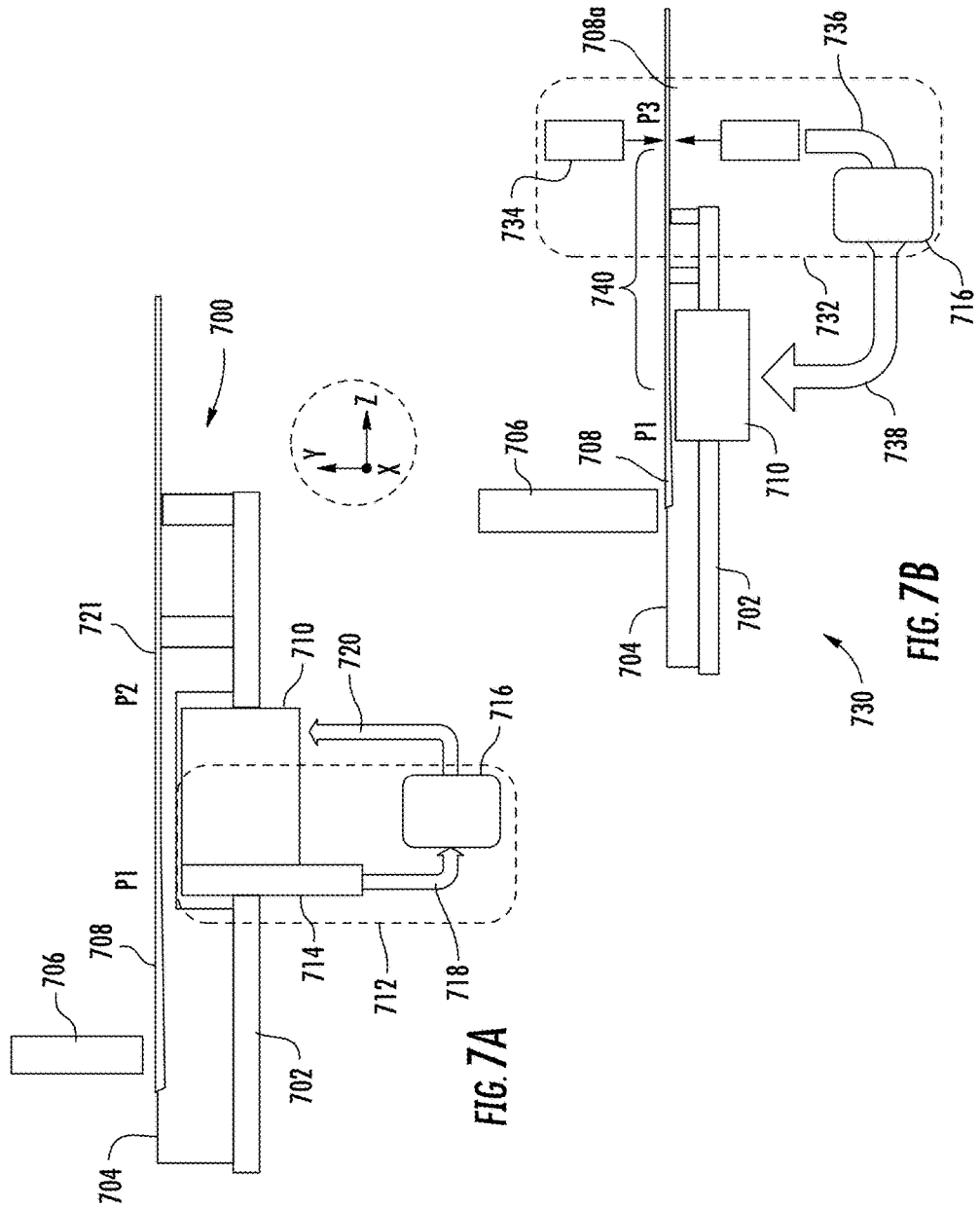

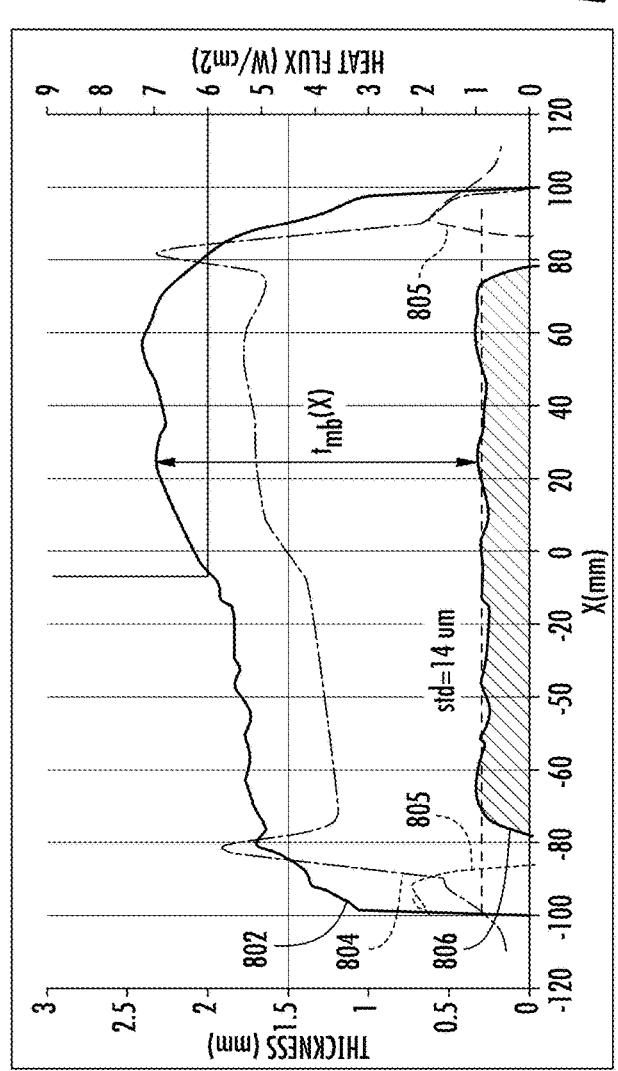
FIG. 8A
FIG. 8B
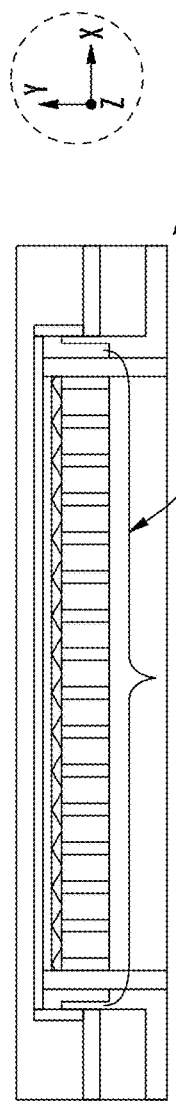
FIG. 8C

APPARATUS AND METHOD FOR CONTROLLING THICKNESS OF A CRYSTALLINE SHEET GROWN ON A MELT

FIELD

The present embodiments relate to monocrystalline substrate formation and, more particularly, to apparatus and techniques for controlling thickness of crystalline material grown from a melt.

BACKGROUND

In the present day techniques have been developed to grow single crystalline (monocrystalline) sheets from a melt of a given material such as silicon. This is accomplished by crystallizing a thin solid layer of the given material at a given position on a surface of a melt composed of the given material, and pulling the thin solid layer along a pull direction. As the monocrystalline material is drawn along a given direction, a ribbon of monocrystalline material may form in which one end of the ribbon remains stationary at the given position or crystallization region in which crystallization takes place. This crystallization region may define a crystallization front (leading edge) between the monocrystalline sheet and the melt that is defined by a crystal facet that forms at the leading edge.

In order to sustain the growth of this faceted leading edge in a steady-state condition so that the growth speed matches the pull speed of the monocrystalline sheet, or "ribbon," intense cooling may be applied by a crystallizer in the crystallization region. This may result in formation of a monocrystalline sheet whose initial thickness is commensurate with the intensity of the cooling applied, which initial thickness is often on the order of 1-2 mm in the case of silicon ribbon growth. However, for applications such as solar cells to be formed from a monocrystalline sheet or ribbon, a target thickness may be on the order of 200 µm or less. This requires a reduction in thickness of the initially formed ribbon, which may be accomplished by heating the ribbon over a region of a crucible that contains the melt as the ribbon is pulled in a pulling direction. As the ribbon is drawn through the region while the ribbon is in contact with the melt a given thickness of the ribbon may melt back, thereby reducing the ribbon thickness to a target thickness. This melt-back approach is particularly well suited in the so-called Floating Silicon Method (FSM), which forms a silicon sheet on the surface of a silicon melt according to the procedures generally described above.

However, during growth of a monocrystalline sheet using a method such as FSM, sheet thickness may vary across the width of the monocrystalline sheet, that is, along a transverse direction that is perpendicular to the pull direction. This may vary from run to run, or even within a run, where a run corresponds to a process that produces a single ribbon of monocrystalline material. Additionally, because the final target thickness of a ribbon may be a factor of ten thinner than the initial thickness, precise control of thickness uniformity may be especially important. For example, a device application may specify a substrate thickness of 200 µm+/− 20 µm. If a monocrystalline sheet is crystallized that has an initial thickness of 2 mm near the crystallizer and an initial thickness variation of 5% (or 100 µm), without correction of this initial thickness variation, after the ribbon is thinned to 200 µm thickness by drawing the ribbon through a melt-back region, the thickness variation of 100 µm now constitutes a 50% variation in thickness, which may render the ribbon useless for its intended application. Moreover, the thickness of a ribbon may vary along the transverse direction in a manner that is not easily corrected by melting back the ribbon using a conventional heater.

It is with respect to these and other considerations that the present improvements have been needed.

SUMMARY

This Summary is provided to introduce a selection of concepts in a simplified form that are further described below in the Detailed Description. This Summary is not intended to identify key features or essential features of the claimed subject matter, nor is it intended as an aid in determining the scope of the claimed subject matter.

In one embodiment, an apparatus for controlling thickness of a crystalline sheet grown from a melt may include a crucible configured to contain the melt, the melt having an exposed surface that is separated from a floor of the crucible by a first distance; a housing comprising a material that is non-contaminating with respect to the melt, the housing comprising a plurality of sidewalls and a top that are configured to contact the melt; and a plurality of heating elements isolated from the melt and disposed along a transverse direction that is perpendicular to a pulling direction of the crystalline sheet, the plurality of heating elements being individually powered, wherein the plurality of heating elements are disposed at a second set of distances with respect to the exposed surface of the melt that are less than the first distance, and wherein the plurality of heating elements are configured to vary a heat flux profile along the transverse direction when power is supplied individually to the plurality of heating elements.

In another embodiment, a system for growing a crystalline sheet from a melt, may include a crucible configured to contain the melt, the melt having an exposed surface that is separated from a floor of the crucible by a first distance; a crystallizer configured to generate a crystallization front of the crystalline sheet along a surface of the melt at a first position and a crystal puller configured to pull the crystalline sheet along a pull direction, wherein at a second position downstream of the crystallizer the crystalline sheet has an initial thickness profile along a transverse direction that is perpendicular to the pull direction. The system may also include a segmented heater downstream of the second position, the segmented heater comprising a housing and a plurality of heating elements disposed along the transverse direction, wherein the housing is disposed between the plurality of heating elements and the melt, wherein the plurality of heating elements are disposed at a second set of distances with respect to the exposed surface of the melt that are less than the first distance and wherein the plurality of heating elements are configured to vary a heat flux profile along the transverse direction so as to melt back the crystalline sheet to generate at a third position downstream of the second position, a final thickness profile along the transverse direction that is more uniform than the initial thickness profile.

In a further embodiment, a method for controlling thickness of a crystalline sheet may include generating a crystallization front of the crystalline sheet on a surface of a melt using a crystallizer, pulling the crystalline sheet away from the crystallization front along a pull direction, wherein at a first position downstream of the crystallization front, the crystalline sheet has an initial thickness profile along a transverse direction that is perpendicular to the pull direction, and melting back the crystalline sheet over a melt-back region using a plurality of heating elements disposed adjacent the crystalline sheet at different positions along the transverse direction wherein the plurality of heating elements are disposed at a set of distances from the surface of the melt that are less than a melt depth of a crucible containing the melt. The plurality of heating elements may be configured to vary a heat flux profile along the transverse direction so as to melt back the crystalline sheet to generate, in the crystalline sheet at a position downstream of the melt back region, a final thickness profile along the transverse direction that is more uniform than the initial thickness profile.

BRIEF DESCRIPTION OF THE DRAWINGS

FIG. 1 depicts a processing system for growing a crystalline sheet from a melt according to embodiments of the disclosure;

FIG. 2A depicts a side view and FIG. 2B depicts an end view, respectively, of another processing system according to additional embodiments of the disclosure;

FIG. 2C presents another end cross-sectional view of the segmented heater of FIG. 2A;

FIG. 3A depicts an end cross-sectional view of another processing system in accordance with further embodiments of the disclosure;

FIG. 3B depicts one embodiment of a segmented heater;

FIG. 3C depicts heat flux that may be generated by the segmented heater of FIG. 3B;

FIG. 3D depicts another embodiment of a segmented heater;

FIG. 3E depicts heat flux that may be generated by the segmented heater of FIG. 3D;

FIG. 3F depicts a further embodiment of a segmented heater;

FIG. 3G depicts heat flux that may be generated by the segmented heater of FIG. 3F;

FIG. 3H depicts one instance of operation of the segmented heater of FIG. 3F;

FIG. 3I depicts heat flux that may be generated by the segmented heater in FIG. 3H;

FIG. 6A depicts an embodiment of another segmented heater in which an outer section towards one edge of segmented heater is shown;

FIG. 6B depicts a simulated heat flow for the segmented heater of FIG. 6A;

FIG. 6C depicts the calculated melt back profile 620 shown as thickness of a crystalline sheet that is melted as a function of position along the X-axis for a segmented heater generally arranged according to the segmented heater 600.

FIG. 7A depicts a processing system according to various embodiments of the disclosure;

FIG. 7B depicts another embodiment of a processing system;

FIGS. 8A-8C provide details of one implementation of thickness control of a crystalline sheet according to embodiments of the disclosure;

DETAILED DESCRIPTION

Figure 4A:
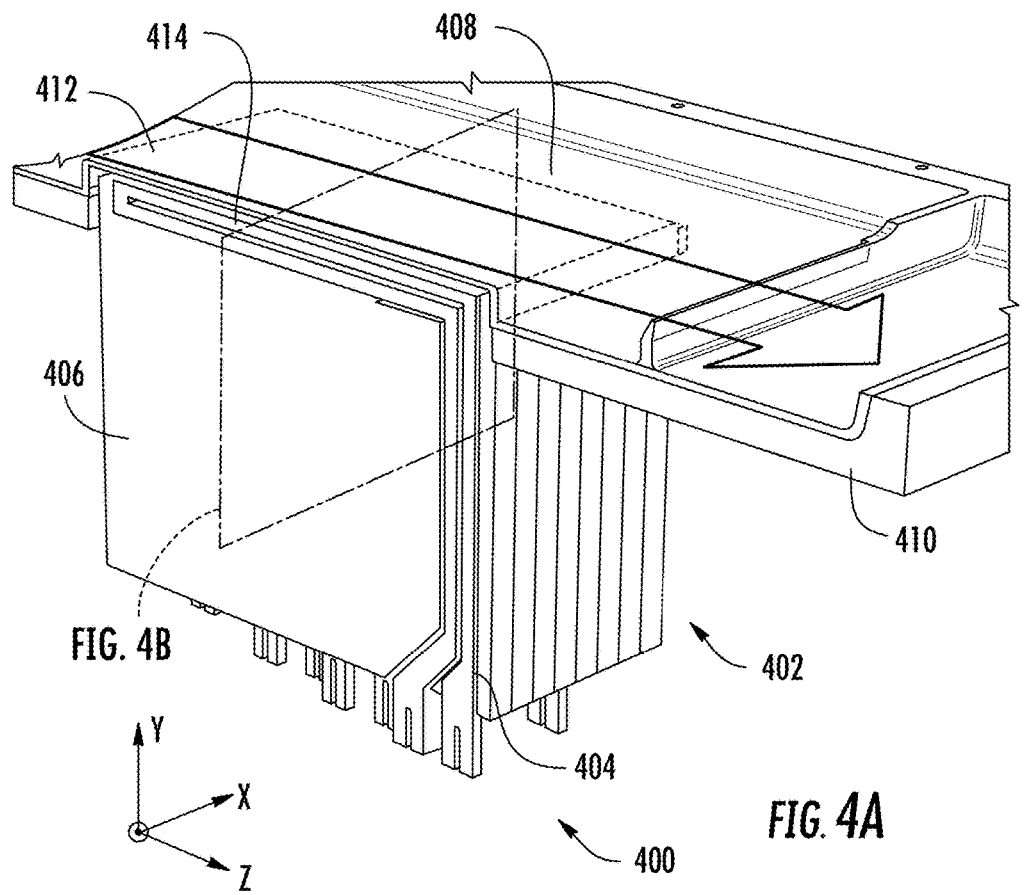
FIG. 4A depicts a top perspective view of another embodiment of a processing apparatus.

The present embodiments will now be described more fully hereinafter with reference to the accompanying drawings, in which some embodiments are shown. The subject matter of the present disclosure, however, may be embodied in many different forms and should not be construed as limited to the embodiments set forth herein. Rather, these embodiments are provided so that this disclosure will be thorough and complete, and will fully convey the scope of the subject matter to those skilled in the art. In the drawings, like numbers refer to like elements throughout.

The present embodiments provide multiple advantages for growth of crystalline sheets not found in the conventional technology. For example, embodiments provide a melt-back heater whose melt-back heat profile can be tuned in-situ to match the thickness non-uniformity that may be produced when a crystalline sheet is crystallized on the surface of a melt. The sheet thickness may then be selectively reduced by applying the melt-back heat profile to the crystalline sheet during drawing of the crystalline sheet along the melt surface without introducing any further non-uniformity, thereby resulting in a final sheet that has uniform thickness. Particular embodiments provide melt back of a crystalline sheet over select portions of the crystalline sheet with a spatial resolution commensurate with common crystalline sheet non-uniformities.

Embodiments provide further advantages in that a melt-back apparatus may tailor all aspects of a thickness profile of the crystalline sheet to match the exact form-factor requirement for a target application, such as solar energy substrates. These aspects may include thickness, thickness uniformity, and width of a crystalline sheet. In this manner, after processing in a melt-back apparatus, a crystalline sheet may be processed directly into a single crystalline substrate product merely by cutting the crystalline sheet into a desired length.

Various embodiments provide a convenient manner for providing high quality edges to single crystalline substrates, which often suffer from undesirable crystallographic effects produced at the sides or edges of a single crystalline sheet. The width of such defects may scale with the end profile of a gas cooling device (crystallizer) used to crystallize the crystalline sheet on a melt surface, which may be generally on the order of 1-2 cm. As detailed below, some embodiments provide apparatus and methods to melt back these "side effects" completely, yielding clean edges of the single crystalline sheet as it is drawn (pulled) along the surface of the melt. Further advantages provided by the present embodiments include a robust and practical construction of a melt-back heater that is non-contaminating for a crystalline sheet that is being fabricated.

FIG. 1 depicts a processing system 100 for growing a crystalline sheet from a melt according to embodiments of the disclosure. Unless otherwise indicated, the term "ribbon" may be used herein to refer to a crystalline sheet, and in particular may refer to a form of a monocrystalline sheet that is formed by pulling a monocrystalline sheet along a surface of a melt. The processing system 100 may include a crucible holder 102, and crucible 104, which may be arranged as known in the art. The processing system 100 may be used, for example, to grow silicon ribbons as detailed below. The crucible 104 may contain a melt 106 from which a ribbon is to be extracted. Heaters 112 are provided to generate heat flux that flows toward an upper surface of the melt 106, which heat flux is indicated generally by the vertical arrows. A crystallizer 108 is provided to generate localized cooling to initiate crystallization of a crystalline sheet 110. This is also shown by vertical arrows that indicate rapid heat removal from a portion of the surface of melt 106. The crystallizer 108 may be arranged as known in the art, for example, having cooling gas jets that generate rapid heat removal from a portion of the melt adjacent the crystallizer 108.

The crystalline sheet 110 may be drawn along a pulling direction 114 by a crystal puller 117 where the pulling direction is parallel to the Z-axis in the Cartesian coordinate system shown. Steady state conditions may be established by the processing system 100 such that a leading edge 115 is formed that is stationary and may be adjacent the crystallizer 108 on the surface of the melt 106. As material is crystallized from the melt 106, the crystalline sheet 110 is pulled along the pulling direction 114 such that the overall length (generally along the Z-axis) of a ribbon formed from the crystalline sheet 110 increases with time. The initial thickness of the crystalline 110 sheet may range from one to three millimeters near the crystallizer 108 in some examples. However, the embodiments are not limited in this context. In some examples, the width of a crystalline sheet such as crystalline sheet grown in accordance with the present embodiments may in the range of 100 mm to 200 mm. The embodiments are not limited in this context. The sheet width W may refer to width of a crystalline sheet along a direction that is perpendicular to the pulling direction, such as along a direction parallel to the X-axis, as shown in FIG. 2B.

As further shown in FIG. 1, the crystalline sheet 110 may be separated from the melt 106 as the crystalline sheet 110 is drawn along the pulling direction 114. In addition, the crystalline sheet 110 may be thinned by melting back a portion of the thickness of the crystalline sheet, so that the final thickness (parallel to the Y-axis) of the crystalline sheet 110 is substantially thinner than an initial thickness formed near the leading edge 115. Depending upon the target application for the crystalline sheet 110, a final thickness may be less than one millimeter, such as one half millimeter, 200 μm, or thinner. Such thicknesses may be appropriate for growing ribbons composed of monocrystalline silicon. In accordance with embodiments of the disclosure, the processing system 100 includes a segmented heater 116, which extends below a portion of the melt 106 along the Z-axis. The segmented heater 116 may be employed to provide sufficient heat flux density to the crystalline sheet 110, so as to gradually melt back the crystalline sheet 110 as it is pulled along the pulling direction 114. However, unlike conventional heaters, the segmented heater 116 may provide a tailored heat flux profile along a transverse direction to the pulling direction 114, in other words, perpendicular to the pulling direction 114 and parallel to the X-axis. As detailed below, this tailored heat profile may provide a variable heat flux along the transverse direction that is arranged so as to generate a thinner crystalline sheet that has a desired thickness and thickness uniformity in the transverse direction. The tailored heat profile may account for variations in the initial thickness of the crystalline sheet 110 before melt back is performed by the segmented heater 116.

In particular, as detailed below, in various configurations a segmented heater such as segmented heater 116 may include multiple heating elements that are individually powered so as to generate variations in heat flux along the transverse direction. The variations in heat flux along the transverse direction may be received by different sections of a crystalline sheet along the transverse direction so as to selectively melt back one section at a different melting rate as opposed to another section. This allows the overall reduction in thickness of a given section of the crystalline sheet to be either enhanced or slowed to account for differences in thickness of the crystalline sheet at different sections along the transverse direction.

FIG. 2A depicts a side view and FIG. 2B depicts an end view of another processing system 200 according to additional embodiments of the disclosure. In this example, the processing system 200 may include components similar or the same as those shown in processing system 100, which are similarly labeled. The processing system 200 includes a segmented heater 210, which may be a variant of the segmented heater 116. In particular, FIG. 2B presents an end cross-sectional view through the segmented heater 210 at the position indicated by the dashed line of FIG. 2A, which is downstream from the crystallizer 108. As illustrated in FIG. 2B the segmented heater 210 includes multiple heating elements 222, which may be arranged along the transverse direction, that is, along the X-axis, where the Z-axis is parallel to pulling direction 114.

Referring again to FIG. 2A, as the crystalline sheet 204 is formed under the crystallizer 108, the crystalline sheet 204 may be drawn toward the right as illustrated along the pulling direction 114. A leading edge 218 may be formed which is stably positioned adjacent the crystallizer 108. As crystalline material forms from the melt 202, the crystalline sheet 204 may grow to a given thickness along the Y-axis, which is dependent upon the cooling rate provided by the crystallizer 108, as well as the pulling rate of the crystalline sheet 204 and the rate of heat flow from the melt 202. As illustrated in FIG. 2A and FIG. 2B, the region 208 of the crystalline sheet 204 corresponds to a position proximate the left edge (upstream edge) of the segmented heater 210. The segmented heater 210 includes a housing 220, which may be composed of a material such as fused quartz, where the housing is non-contaminating with respect to the melt 202. For example, a fused quartz housing may react at a slow rate with a silicon melt, but only provides silicon and oxygen to the melt when reacted, the latter of which may be gettered from the melt. The housing 220 may include a top 224 and sides 226. The top 224 may extend at a height h1 above a lower surface 228 of the crucible 104, such that the top is closer to the exposed surface 230 of melt 106. The housing 220 may isolated the heating elements 222 from the melt by forming a complete barrier that contacts the crucible 104, or alternatively, is integral with the crucible 104.

As shown in FIG. 2B the top 224 of the housing 220 may be disposed at a height h2 below the exposed surface 230, where h1+h2 is equivalent to the melt depth d., where the melt depth refers to the depth of melt from the lower surface 228 to exposed surface 230. In some examples, h2 may range from 1 mm to 5 mm. In some embodiments the height h2 may be 3 mm, which may accommodate a crystalline sheet having an initial thickness of 2 mm while placing the top 224 sufficiently close to the exposed surface to provide localized heating as detailed below.

The region 208 of the crystalline sheet 204 shown in FIG. 2A and in cross-section in FIG. 2B represents the point in which the crystalline sheet 204 may experience increased heat flux that is sufficient to melt back the crystalline sheet 204. As suggested by FIG. 2A, the heating elements 222 may extend along a length of the segmented heater 210 to generate heat flux sufficient to melt back the crystalline sheet 204 while it extends above the segmented heater 210 as the crystalline sheet 204 is pulled in the pulling direction 114. This may cause gradual thinning of the crystalline sheet 204, resulting in a final thickness of the crystalline sheet 204 of less than 500 µm in some instances.

Returning to FIG. 2B, there is shown a segmented heater assembly composed of a plurality of heating elements, labeled as heating elements 222 arranged side-by side along the transverse direction to the pulling direction 114. The heating elements 222 may be resistive heating elements that are individually powered in various embodiments, which allows each heating element to deliver a different level of heat flux than another heating element. As shown in more detail below, the heating elements 222 may extend parallel to the Z-axis or pulling direction 114 such that a given heating element supplies heat flux to a same section of the crystalline sheet 204 as specified with respect to the transverse direction that lies along the X-axis. For example, the heating element 222a is disposed closer to the section 231 that represents the left periphery of the crystalline sheet 204. Accordingly, under certain conditions, the heating element may supply a greater fraction of heat flux to section 231 than other heating elements; similarly, the heating element 222b, which is disposed closer to the section 232 than other heating elements, may supply a greater fraction of heat flux to section 232 than other heating elements; the heating element 222c may supply a greater fraction of heat flux to section 234 than other heating elements; the heating element 222d may supply a greater fraction of heat flux to section 236 than other heating elements, while the heating element 222e may supply a greater fraction of heat flux to section 238 than other heating elements. By individually adjusting the current or power supplied to a given heating element, the heating elements 222 as a whole may generate a heat flux profile along the transverse direction (X-axis) that exhibits a varying heat flux between different sections.

As shown in FIG. 2B the region 208 of the crystalline sheet 204 may be characterized by a thickness profile along the X-axis that exhibits a varying thickness and may be characterized by different types of roughness components. In accordance with various embodiments, the heating elements 222 may be individually powered so as to generate a heat flux profile where the heat flux also varies along the X-axis in order to melt back the crystalline sheet 204 to different degrees in different sections of the crystalline sheet as it is drawn above the segmented heater 210. This may result in a more uniform thickness of the crystalline sheet 204 after the crystalline sheet has completed melt back processing and is no longer disposed above the segmented heater 210.

FIG. 2C presents another end cross-sectional view of the segmented heater and crystalline sheet 204, in this case, in the region 214 that is located proximate the right edge (downstream edge) of the segmented heater 210. At this point the melt back processing provided by the segmented heater 210 generates a thinner crystalline sheet, which additionally exhibits a more uniform thickness than in the region 208.

As further suggested in FIGS. 2B and 2C the heating elements 222 may be disposed close to the top 224 of the housing 220 in order to more effectively direct localized heat flux to the crystalline sheet 204. For example, in some embodiments the heating elements 222 may be disposed at a distance at a set of distances that are 5 mm or less from the top 224. In some embodiments, the heating elements 222 may be disposed at a common distance h3 from the exposed surface 230, which may be equal to 5 mm or less. The embodiments however are not limited in this context. In some examples, the width of the segmented heater 210 along the transverse direction parallel to the X-axis may be in the range of 100 mm to 200 mm, and the number of heating elements may be in the range of 10 to 25. Accordingly, the separation along the transverse direction between adjacent heating elements may range from 4 mm to 20 mm. In addition, in order to isolate heating elements 222 from one another so that heat flux may be directed toward the crystalline sheet 204, an insulator assembly 240 may be provided within the segmented heater 210. The insulator assembly 240 may be composed of a plurality of insulator portions in some embodiments.

As also shown in FIG. 2A, the processing system 200 may include a thickness measurement system 206 that is configured to measure a current thickness profile of the crystalline sheet 204 along the transverse direction. In the example of FIG. 2A the thickness measurement system 206 is disposed adjacent the region 208 so as to measure thickness of the crystalline sheet 204 just before the crystalline sheet is drawn over the segmented heater 210. In this example, a current thickness profile may thus represent the received thickness profile of the crystalline sheet along the transverse direction just before melt back takes place.

The processing system 200 may also include a heater control system 216 that is configured to control power supplied to the plurality of heating elements 222, which may be used to generate an adjusted heat flux profile. The adjusted heat flux profile may be effective to melt back the crystalline sheet as it is drawn over the segmented heater 210 in a manner that generates an adjusted thickness profile along the transverse direction that has improved thickness uniformity in comparison to that of the current thickness profile. In some examples, the current thickness profile may be measured at a position before the crystalline sheet 204 is exposed to the segmented heater 210, and signals that include the thickness profile may be forwarded to the heater control system 216. In turn, the heater control system 216 may send control signals to individually adjust power that is supplied to heating elements 222 in order to generate an appropriate heat flux profile to provide a tailored melt-back treatment of the crystalline sheet 204. Details of measurement and control components are provided with respect to figures to follow.

In various embodiments, the structure of a segmented heater in the region proximate heating elements and a top of the housing is engineered to tailor the heat transfer rate to a melt above the segmented heater. The structure of this region may utilize the heat transfer mechanisms of conduction and radiation. Examples of materials employed by a segmented heater include fused quartz, which is semitransparent. Other components of a segmented heater according to various embodiments include opaque materials of high thermal conductivity such as graphite, and opaque materials having medium thermal conductivity such as porous ceramic. In the case of graphite, this material may be suitable as conductor assembly disposed between heating elements and a top of a housing of the segmented heater. The conductor assembly may be engineered to direct heat more vertically or more laterally (horizontally) to tailor the heat flux profile at the surface of a melt. The porous ceramic may be used for example, as a heat shield to restrict heat transfer laterally at elevated temperature characteristic of that employed to melt silicon. Other materials used in exemplary segmented heater include inert gas, such as argon, which may fill cavities within the segmented heater and provide high transparency and low thermal conductivity.

In various embodiments, these components may be engineered to increase the lateral spread of heat (in the X-Z plane) sufficiently to reduce the residual signature of individual heating elements at the melt surface in which a crystalline sheet is disposed. For example, the amplitude of wiggles or waves (wiggle amplitude) in a heat flux profile at the melt surface may be less than 1% with respect to total level of heat flux. At the same time, the components of a segmented heater may be engineered to provide local increased heat flow restricted to a transverse length on the order of the separation between adjacent heating elements, such as one to three times the separation of heating elements. In this manner, unwanted fluctuations in heat flux may be reduced or eliminated at a melt surface while local changes in heat flux along the transverse direction can be deliberately generated.

FIG. 3A depicts an end cross-sectional view of another processing system 300 in accordance with further embodiments of the disclosure. For clarity only a portion of the processing system 300 is shown. The processing system 300 may include one or more crucible heaters, shown as the crucible heater 304, which heaters may supply heat flux to the crucible 308 via the crucible holder 306. This heat flux may be used to maintain the melt 320 in a molten state. The processing system 300 further includes a segmented heater 302 that is composed of an insulator assembly 310 and heating elements 312. In addition, the segmented heater 302 includes a conductor assembly 314, which may include at least one conductor part that has relatively high thermal transfer rate in comparison, for example to the thermal transfer rate of the insulator assembly 310. As illustrated, the conductor assembly 314 is disposed between the heating elements 312 and top 316 of the housing 317 of segmented heater 302.

In various embodiments the design of a conductor assembly, such as the conductor assembly 314, may be tailored to adjust a heat flux profile generated by a segmented heater. When the heat is conducted through the melt 320 to a crystalline sheet 318, depending upon the initial thickness profile, it may be desirable to provide a more uniform heat flux profile, or a heat flux profile that can be varied over a small length scale.

FIG. 3B depicts one embodiment of a segmented heater 330 that is provided with a conductor assembly composed of multiple isolated conductors, shown as conductors 334, that are positioned adjacent respective heating elements 332 so as to direct heat along the direction parallel to the Y-axis as shown. The conductors 334 are also positioned within a cavity 337, which may be filled with argon in one example. The heating elements 332 and conductors 334 are surrounded by an insulator assembly 335, which suppresses heat conduction between neighboring heating elements 332 and neighboring conductors 334. Accordingly, a largest component of heat flux is generated along the Y-axis. This concentrated heat flux generated by the segmented heater 330 may yield a concentrated heat flux at a melt surface at a position directly above a heating element 332.

FIG. 3C depicts heat flux (q") that may be generated by the segmented heater 330. In particular, the curves 336 depict individual heat flux generated by each heating element 332 as a function of position along the X-axis. It may be assumed that the power to each heating element 332 is set to output the same heat, such that the amplitude of each curve 336 is the same. The curve 338 represents the sum of heat flux generated by the segmented heater 330 at a melt surface, which may be disposed 2 mm to 5 mm above a top surface of the segmented heater 330. As illustrated the intensity of heat flux varies in which a maximum amplitude is observed at a position corresponding to the position along the X-axis of a heating element 332. Thus, although this configuration may provide a high localization of heat flux at a melt surface, ripples having significant amplitude may be unavoidable.

FIG. 3D depicts another embodiment of a segmented heater 340 that is provided with a conductor assembly composed of a cavity 347 and a planar conductor 344 that may act as a thermal diffuser. The planar conductor 344 that is positioned between the heating elements 332 and top 345 of a housing of the segmented heater 340. Because the planar conductor 344 has high thermal conductivity, heat that is output by heating elements 332 may also flow laterally within the X-Z plane. This may have the effect of reducing variation of heat flux as a function of position at the surface of a melt. FIG. 3E depicts heat flux that may be generated by the segmented heater 340. In particular, the curves 346 depict individual heat flux generated by each heating element 332 as a function of position along the X-axis. It may also be assumed that the power to each heating element 332 is set to output the same heat, such that the amplitude of each curve 346 is the same. The curve 348 represents the sum of heat flux generated by the segmented heater 340 at a melt surface. As illustrated the intensity of heat flux varies, but the amplitude of variation in heat flux at the surface is less than that of curve 338.

FIG. 3F depicts another embodiment of a segmented heater 350 that is provided with a conductor assembly composed of a cavity, 357 and conductor 354 that are positioned between the heating elements 332 and top 355 of a housing of the segmented heater 350. In this example, the cross-section of the conductor 354 has a sawtooth cross-section in the X-Y plane as shown. The conductor 354 extends the furthest from the top 355 at X-positions that are intermediated between adjacent heating elements 332. This may have the effect of further reducing variation of heat flux as a function of position at the surface of a melt. FIG. 3G depicts heat flux that may be generated by the segmented heater 350. In particular, the curves 356 depict individual heat flux generated by each heating element 332 as a function of position along the X-axis. It may also be assumed that the power to each heating element 332 is set to output the same heat, such that the amplitude of each curve 356 is the same. The curve 358 represents the sum of heat flux generated by the segmented heater 350 at a melt surface. As illustrated the intensity of heat flux along the X-axis is uniform. Of course a heater such as the segmented heater 350 that is capable of providing a uniform heat flux at a melt surface may be employed to provide a variable heat flux along the X-axis by varying current or power supplied among different heating elements.

Although the segmented heater 350 may output a uniform heat flux as shown in FIG. G, the segmented heater 350 may also provide the ability to deliberately vary heat flux in the X-direction on a length scale comparable to that of the heater separation. In other words, under certain conditions, the segmented heater 350 may be capable of generating a uniform heat flux at a melt surface, while under different conditions, a deliberately non-uniform heat flux profile may be generated. FIG. 3I depicts heat flux that may be generated by the segmented heater 350 when a single heating element 332b is powered with higher power than other heating elements 332, as suggested in FIG. 3H. In particular, the curves 366 depict individual heat flux generated by each heating element 332 having a first power that generates a first amplitude, while curve 367 depicts heat flux generated by the heating element 332b which has a second power that generates a second amplitude greater than the first amplitude (the increased size of heating element 332b in FIG. 3I is not indicative of physical size, but of power output). The curve 368 represents the sum of heat flux generated by the segmented heater 350 at a melt surface. As illustrated the intensity of heat flux is uniform except along a portion 370 corresponding to the X-position of heating element 332b which exhibits a peak. In other implementations, a segmented heater may generate other types of non-uniform heat flux profiles, such as a monotonically increasing heat flux profile, a concave heat flux profile, a convex heat flux profile, or heat flux profile of any desired shape, without the superimposition of any unwanted wiggles, such as those shown in FIG. 3C.

Figure 4B:
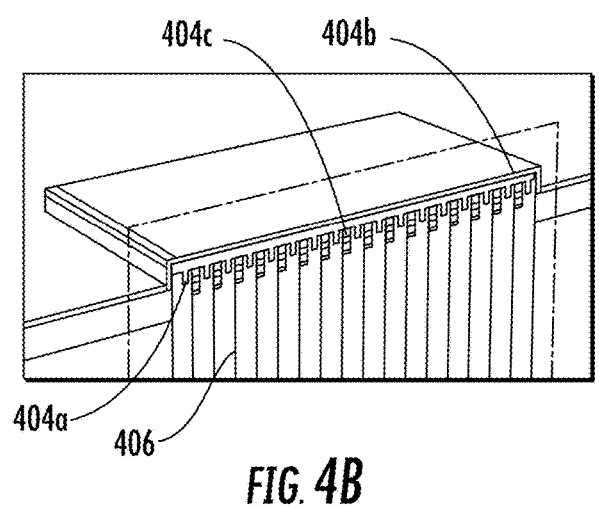
FIG. 4B depicts a perspective cross-sectional view of a portion of a segmented heater of the apparatus of FIG. 4A.

FIG. 4A depicts a top perspective view of another embodiment of a processing apparatus 400. The processing apparatus includes a segmented heater 402 that may be employed to melt back a crystalline sheet 412 as the crystalline sheet 412 is drawn along a pulling direction parallel to the Z-axis. The segmented heater 402 includes a plurality of heating elements 404 and an insulator assembly 406. The heating elements 404 have a "hairpin" configuration in which current is conducted through the hairpin, which may generate resistive heating. Each heating element 404 includes a top portion 414 that is aligned parallel to the Z-axis and parallel to the pulling direction. Accordingly, as the crystalline sheet 412 is drawn over the segmented heater 414a given section of the crystalline sheet 412 as defined with respect to FIG. 2B may remain above the same heating element of heating elements 404 during the entire time the crystalline sheet 412 is exposed to the segmented heater 402. In other words, a first outer section (not shown) of the crystalline sheet 412 may remain over a first outer heating element 404a as shown in FIG. 4B; a second outer section (not shown) of the crystalline sheet 412 may remain over a second outer heating element 404b; a middle section (not shown) of the crystalline sheet 412 may remain over a middle heating element 404c, and so forth. In addition the heating elements 404 may be disposed at a constant distance from a surface of the melt 408 along the transverse direction (parallel to the X-axis) and along the pulling direction (parallel to the Z-axis). This allows the integrated heat flux that is applied by the segmented heater 402 to the crystalline sheet 412 to be more precisely tailored for any given section (along the X-axis of the crystalline sheet 412, since the same heating element remains adjacent to a corresponding section of the crystalline sheet 412 and at a constant distance from the melt surface.

Figure 5A:
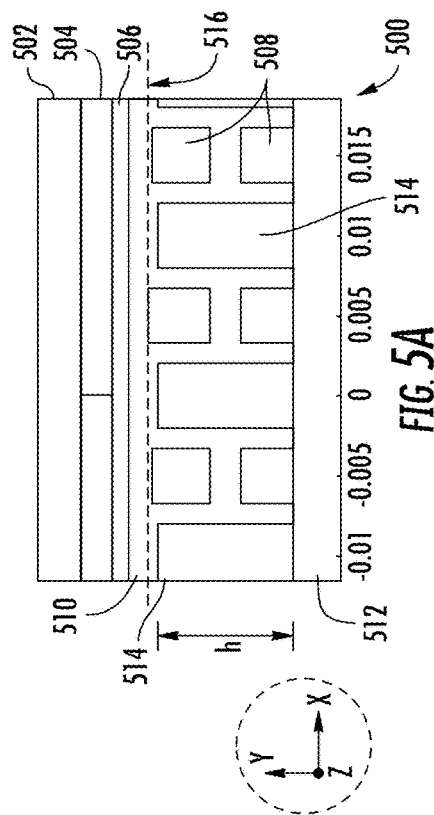
FIG. 5A depicts a portion of a cross-section of an exemplary segmented heater in schematic form.

In additional embodiments, the heat flux profile that is output by a segmented heater may be tailored by adjusting the configuration of an insulator assembly that is disposed around heating elements. FIG. 5A depicts a portion of a cross-section of segmented heater 500 in schematic form. A melt 502 is disposed above a housing 504 which is disposed above a conductor 506. A set of three heating elements are shown in which a heating element 508 is composed of two portions, which may be a first turn and second turn of a hairpin-type heating element, as shown in FIG. 4. The heating elements 508 may be disposed within a cavity 510 into which an ambient such as inert gas is provided. An insulator assembly 512 includes a series of thermal barriers 514 (plugs) that extend between adjacent heating elements. In order to tailor the heat flux profile generated by the segmented heater 500 at the surface of the melt 502, the height of the thermal barriers 514 may be adjusted. In some examples, the height of the thermal barriers 514 may be such that a top of the thermal barriers 514 coincides with a surface 516 defined by a top of the heating elements 508. In other examples, the height of the thermal barriers may be such that the top of thermal barriers 514 is recessed with respect to the surface 516 or extends above surface 516.

Figure 5B:
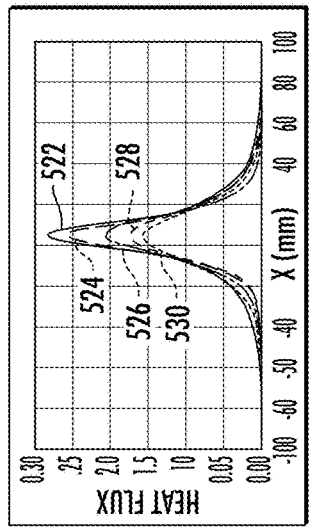
FIG. 5B depicts heat flux profiles produced when a height of a thermal barrier is varied in a segmented heater depicted in FIG. 5A.

FIG. 5B depicts a series of calculated heat flux profiles produced when a height of a thermal barrier is varied in a segmented heater as generally depicted in FIG. 5A. In this example the thermal barrier material is a porous ceramic material that provides a strong barrier to heat transfer including at elevated temperatures comparable to that of a silicon melt. The thermal barriers have a width of 4 mm along the X-axis. The curve 522 represents a heat flux curve generated by an individual heating element in a configuration in which the thermal barriers extend 2 mm above the surface 516; curve 524 represents a configuration in which the top of thermal barriers are coincident with the surface 516; curve 526 represents a configuration in which the top of thermal barriers are 3 mm below the surface 516; curve 528 represents a configuration in which the top of thermal barriers are 6 mm below the surface 516; and curve 530 represents a configuration in which the top of thermal barriers are 9 mm below the surface 516. As illustrated, when the height of the thermal barriers is reduced the peak amplitude of heat flux is reduced and the full width at half maximum (FWHM) of heat flux peak increases.

Figure 5D:
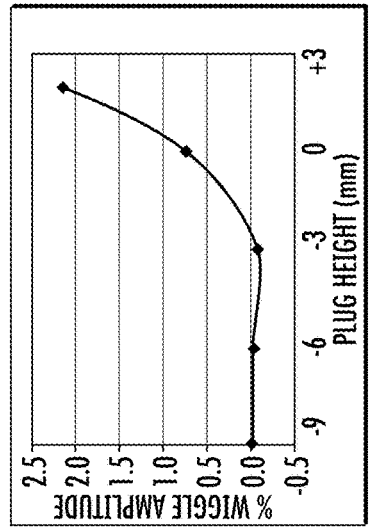
FIG. 5D plots the amplitude of the heat flux fluctuations as a function of the height of a thermal barrier based upon the results of FIG. 5C.
Figure 5E:
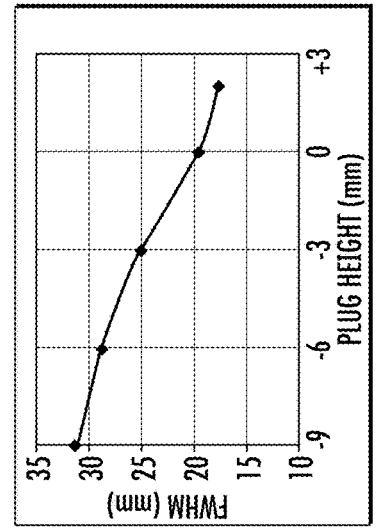
FIG. 5E plots the FWHM of heat flux profiles from individual heating elements as a function of the thermal barrier height.
Figure 5C:
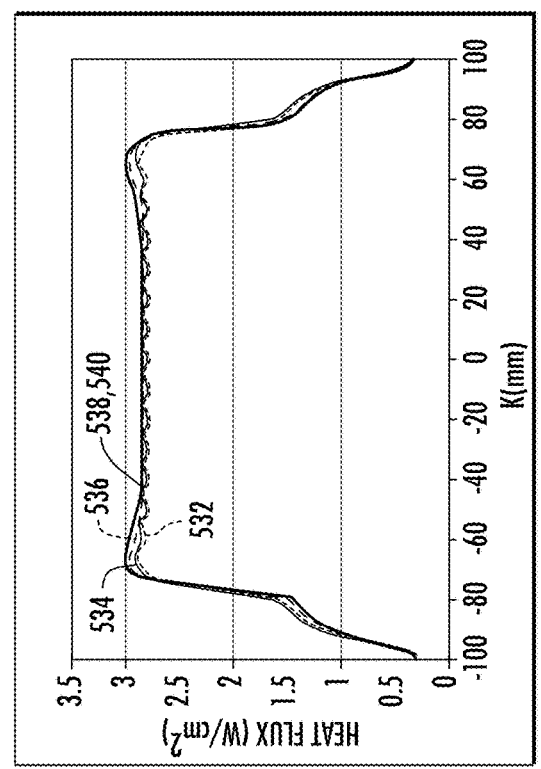
FIG. 5C illustrates heat flux curves produced from an array of multiple heating elements corresponding to the configuration used to generated the curves of FIG. 5B.

FIG. 5C illustrates a series of heat flux curves produced from an array of multiple heating elements corresponding to the configurations used to generated the curves of FIG. 5B. The curve 532 represents a heat flux curve for a configuration in which the thermal barriers extend 2 mm above the surface 516; curve 534 represents a configuration in which the top of thermal barriers are coincident with the surface 516; curve 536 represents a configuration in which the top of thermal barriers are 3 mm below the surface 516; curve 538 represents a configuration in which the top of thermal barriers are 6 mm below the surface 516; and curve 540 represents a configuration in which the top of thermal barriers are 9 mm below the surface 516. As illustrated, when the height of the thermal barriers is reduced the variation in heat flux (wiggles) at the surface is damped out such that the undulations observed in curve 532 are no longer present in curves 536, 538 and curve 540.

FIG. 5D plots the amplitude of the heat flux fluctuations (wiggles) as a function of the height of a thermal barrier 514 (plug) with respect to the surface 516 based upon the results of FIG. 5C. As shown, the amplitude is zero until the thermal barrier extends flush with the surface 516 (0) or above the surface 516 (+2 mm). FIG. 5E plots the FWHM of heat flux profiles from individual heating elements as a function of the thermal barrier height. As shown, the FWHM decreases monotonically with increased thermal barrier height. The data shown in FIGS. 5D and 5E may be taken into account when designing a segmented heater. For example, a smaller FWHM is indicative of finer control of varying heat flux as a function of position along the X-direction. However, as FHWM decreases with increased thermal barrier height, the amplitude of fluctuations in heat flux at the melt surface increases. Accordingly, a thermal barrier height corresponding to −3 mm may be desirable to achieve the smallest FWHM and therefore finest control that can be achieved without experiencing any surface fluctuations in heat flux.

In additional embodiments, a segmented heater may be configured to generate a controllably non-uniform heat flux profile at a melt surface. FIG. 6A depicts an embodiment of a segmented heater 600 in which an outer section towards one edge of segmented heater 600 is shown. The segmented heater 600 may be configured generally the same as the segmented heater 500 discussed above, except for the differences detailed below. The segmented heater 600 may include, for example 20 heating elements 508 arranged next to one another along the X-axis as generally shown in FIG. 4. The heating elements 508 may be separated by thermal barriers that extend to a height 3 mm below the surface 516. However, the two outer heating elements 508 that are nearest an edge of the segmented heater 600 along the X-axis may be separated by a high thermal resistance thermal barrier assembly, shown as thermal barrier assembly 604. In the example illustrated, the thermal barrier assembly 604 includes a thermal barrier 606 having a height that extends 2 mm above the surface 516, and further includes a cavity 510a that replaces a portion of the conductor 506, and may be filled with inert gas. The thermal barrier assembly 604 acts to increase the thermal isolation between outer heating element 508a and other heating elements. In this manner heat generated by the outer heating element 508a is channeled more strongly along the Y-axis upwardly toward a portion of the melt 502 disposed directly above the outer heating element 508a. In some embodiments, a segmented heater may include a pair of outer thermal barriers configured as shown for the thermal barrier assembly 604.

FIG. 6B depicts a simulated heat flow for the segmented heater 600, illustrating that the heat flux 610 in the direction parallel to the Y-axis is more concentrated above the outer heating element 508a as opposed to other positions along the X-axis.

A segmented heater such as segmented heater 600, having such a non-uniform heat flux profile, may be employed to selectively melt back edges of a crystalline sheet at a higher rate. This may be useful to facilitate trimming of edges of a crystalline sheet, which edges are frequently the source of non-uniformities, rough features, and other defects. FIG. 6C depicts the calculated melt back profile 620 shown as thickness of a crystalline sheet that is melted as a function of position along the X-axis for a segmented heater generally arranged according to the segmented heater 600. The melt back profile 620 is characteristic of a segmented heater having a width along the X-axis (transverse direction to the pulling direction) of 175 mm. As shown, the melt back thickness in constant within the majority of the region spanned by the segmented heater, having a value of 1.08 mm. On either edge, a peak 630 in meltback thickness having a peak value of 1.35 mm and a FWHM of a few mm is observed. Thus, in this example, two edge regions of a crystalline sheet, where the edge regions have a width a few millimeters, may be selectively melted at a rate approximately 25% greater than interior regions. This type of spiked profile may be used to melt back edges of a crystalline sheet and remove any defects or protuberances at the edges. For example, the heat flux spikes represented by the peaks 630 may be used to reduce or remove side defects on a crystalline sheet having dimensions on the order of 1-2 cm.

In various embodiments, the operation of a segmented heater may be adjusted in-situ during processing of a crystalline sheet. This allows settings of segmented heaters to be tailored according to the actual, real-time properties of a crystalline sheet, and in particular, the thickness profile of a crystalline sheet. FIG. 7A depicts a processing system 700 according to various embodiments of the disclosure. The processing system 700 is capable of adjusting heat applied to a crystalline sheet 708 in response to real-time measurements of the thickness of crystalline sheet 708. In the configuration shown, the processing system 700 includes a crucible 702 that holds a melt 704. A crystallizer 706 is configured to generate the crystalline sheet 708, which may be drawn in a pulling direction parallel to the Z-axis as detailed above. The processing system 700 includes a segmented heater 710, whose structure may be similar to that of any of the embodiments of FIGS. 3A-6A, for example. The processing system 700 further includes a thickness control system 712 that includes a thickness measurement system 714 and heater control system 716. The thickness measurement system 714 may be a known component or set of components, such as an ultrasonic thickness measurement system. The thickness measurement system 714 is configured to generate a thickness profile of the crystalline sheet 708 across the transverse direction, that is, parallel to the X-axis. In the example shown, the thickness measurement system 714 is positioned at a location P1 that is just upstream to the segmented heater 710. A thickness profile that is measured by the thickness measurement system 714 may thus constitute a profile of the crystalline sheet 708 just before melt back is to take place. The thickness measurement system may generate a signal 718 or series of signals that constitute a thickness measurement profile, which is received by the heater control system 716. The heater control system 716 may be configured to control power supplied to heating elements of the segmented heater 710 to generate an adjusted heat flux profile that is effective to melt back the crystalline sheet 708 in a manner that generates an adjusted thickness profile of the crystalline sheet 708 along the transverse direction, where the adjusted thickness profile has improved thickness uniformity in comparison to that of the current thickness profile measured at point P1. In other words, the heater control system 716 may send signals 720 to adjust the current or power in the different heating elements (not shown) of the segmented heater 710 based upon the measured thickness of different sections of the crystalline sheet along the X-axis, where a given section corresponds to a given heating element. The heater control system 716 may include a plurality of power supplies (not separately shown) that send power individually to respective heating elements. The resultant heat flux generated by the different heating elements after the current is adjusted, may be such that the melt back of a target thickness for each section of the crystalline sheet takes place by the instance at which the thinned crystalline sheet 721 emerges from over the segmented heater 710 at point P2.

FIG. 7B depicts another embodiment of a processing system 730. In this example, a thickness control system 732 is composed of a thickness measurement system 734 that is downstream of the segmented heater 710 at a position P3. One example of the thickness control system 732 is a laser thickness monitor as known in the art. The thickness control system 732 may output a thickness profile 736, which causes the heater control system 716 to generate control signals 738 to adjust heating elements in the segmented heater 710.

Because the thickness measurements in the processing system 730 are performed after melt back processing of the crystalline sheet 708 it is possible that measurements of a thinned crystalline sheet at the point P3, shown as crystalline sheet 708a, may show that the thickness profile of the crystalline sheet 708a does not meet a target profile. For example, the thickness variation of a nominally 200 m ribbon may be measured to be 40 m, which may exceed a tolerance for a solar cell application. Accordingly, in this circumstance it may be determined that a region 740 of the crystalline sheet 708 is not recoverable, either because melt back is completed or because not enough time remains for the ribbon to be melted back to reduce the measured thickness variation sufficiently. In order to address this issue, other embodiments provide processing systems having multiple thickness measurement systems. For example, a first thickness measurement system may be located at position P1, while a second thickness measurement system is located at position P3. In different embodiments, monitoring of thickness at either position P1 or position P3, or both, may be performed continuously, periodically, or intermittently. Thickness profiles that are determined both at position P1 and P3 may be forwarded to the heater control system 716, which may determine an appropriate adjusted heat flux profile to melt back a crystalline sheet to meet a target thickness profile. The heater control system 716 may then forward control signals to the segmented heater 710 to generate the adjusted heat flux profile using a plurality of heating elements.

FIGS. 8A-8C provide details of one implementation of thickness control of a crystalline sheet according to embodiments of the disclosure. In FIG. 8A there is shown an initial thickness profile 802, which may be exhibited by a crystalline sheet to be subject to melt back. The initial thickness profile 802 is measured from a crystalline silicon ribbon that is crystallized from a melt. The initial thickness profile 802 is a transverse thickness profile, in that the thickness is measured along the X-axis, which is transverse (perpendicular) to a pulling direction along the Z-axis. The initial thickness profile 802 indicates that the crystalline silicon ribbon has an initial average thickness in the range of 2 mm. However, thickness varies substantially from 1 mm to 2.4 mm over the measured X-range of 200 mm. In the example of FIG. 8A, a target thickness of 300 m is set for the crystalline silicon ribbon after melt back. In order to accomplish this, a segmented heater 810 may be provided as illustrated in FIG. 8B. The segmented heater 810 may include 16 interior heating elements, which may be spaced by inner thermal barriers, in one example, as well as 2 outer heating elements spaced by outer thermal barriers from the inner heating elements, and used to trim the edges of a crystalline sheet. In the example of FIG. 8A and FIG. 8B, given the measured initial thickness profile 802 and target thickness for a crystalline sheet, the initial thickness profile 802 may be used to calculated the required melt back power to be supplied to each heating element of the segmented heater 810 in order to meltback a section of the crystalline sheet. The meltback power Pmb (x) at a given transverse position (X) may be determined according to:

$$P_{mb}(x) = t_{mb}(x) \cdot H_f \rho \cdot V_p \Delta x, \quad (1)$$

where Vp is the ribbon pull velocity, Hf is the latent heat of fusion, ρ is the crystalline density, $t_{mb}(x)$ is the melt back thickness at a given transverse position (X) and Δx is the width of a section of the crystalline sheet. In various embodiments the procedure of applying power may be performed in an iterative fashion to obtain the target thickness uniformity.

FIG. 8A also depicts a calculated heat flux profile 804 to be applied to the crystalline sheet to melt back the crystalline silicon ribbon to obtain a uniform target thickness of 300 Mm after melt back. In one example the calculated heat flux profile may be determined using computational fluid dynamics (CFD) modeling. In FIG. 8C there is also shown a table of calculated power values (shown in units of W) to be applied to 16 different heating elements 812 as well as two outer trimming heating elements, shown as heating elements O1 and O2, in order to generate the calculated heat flux profile. As illustrated, the power levels applied to heating elements toward the right of the figure are significantly higher than those applied to heating elements to the left of the figure where the initial thickness is much less. In addition, the power applied to heating elements O1 and O2 at the peripheral positions is substantially higher than in other positions, resulting in a higher heat flow toward a crystalline sheet at the peripheral positions. This may result in complete melt back of material in those positions. In general the segmented heater 810 may be configured to deliver a first heat flux density adjacent a pair of outer portions of the top of a housing that is greater than a second heat flux density adjacent an inner portion of the top of the housing that is disposed between the pair of outer portions. The configuration may result in targeting melt back at a faster rate at portions of a crystalline sheet disposed above the outer portions.

In particular, the higher power applied to the heating elements O1 and O2 generates the calculated heat flux profile 804 exhibits spikes on both ends of the profile. As noted, this spiked profile may be generated by the structure of the segmented heater 810, in which thermal isolation is provided to heating elements O1 and O2 in the manner described with respect to FIGS. 6A-6C. This thermal isolation, in combination with the increased power applied to the heating elements O1 and O2, results in the ability to generate such spiked heat flux profile as exemplified by the heat flux profile 804. Curve 806 represents the resulting final thickness profile of a crystalline silicon sheet whose initial thickness profile 802 is represented by the upper curve, after application of the calculated heat flux profile 804. Curve portions 805 are simulation artifacts. As illustrated the final thickness profile 806 is much more uniform than the initial thickness profile.

Referring again to FIG. 8B it is to be noted that the heating elements 812 of the segmented heater 810 are spaced at approximately 1 cm from one another. Accordingly, the segmented heater 810 may be employed to remove thickness undulations on the order of 1 cm or more that may take place across the transverse direction of a crystalline sheet by selectively applying different amounts of current to heating elements 812 that are adjacent a given undulation. In other embodiments, spacing between adjacent heaters along the X-axis may be greater or smaller in order to provide control of meltback thickness at an appropriate length scale (ΔX) along the X-direction according to the characteristic length scale of thickness variations or defects within a crystalline sheet, and as specified by Eq. (1).

In other embodiments an accurate 3-dimensional CFD model of a segmented heater may be employed to obtain melt-back response curves. The crystalline sheet to be thinned can be represented by an isothermal boundary on the surface of the melt, at which the heat flux $Q_i(x,z,P_i)$ (from a particular segment heating element at power Pi) can be evaluated. This heat flux may then be integrated (along the pull direction z) to obtain the individual segment melt-back response curves $\Delta t_i(x,P_i)$. These curves may then span the space of obtainable melt-back profiles, and the net melt-back profile Δt(x) is obtained by summing the individual responses (for example, over 16 elements) as provided below:

$$\ddot{q}_i(x, P_i) = \int_x Q_i(x,z,P_i)\,dz \quad (2)$$

$$\Delta t_i(x, P_i) = \frac{1}{V_U L_f \rho} \ddot{q}_i(x, P_i) \quad (3)$$

Figure 9B:
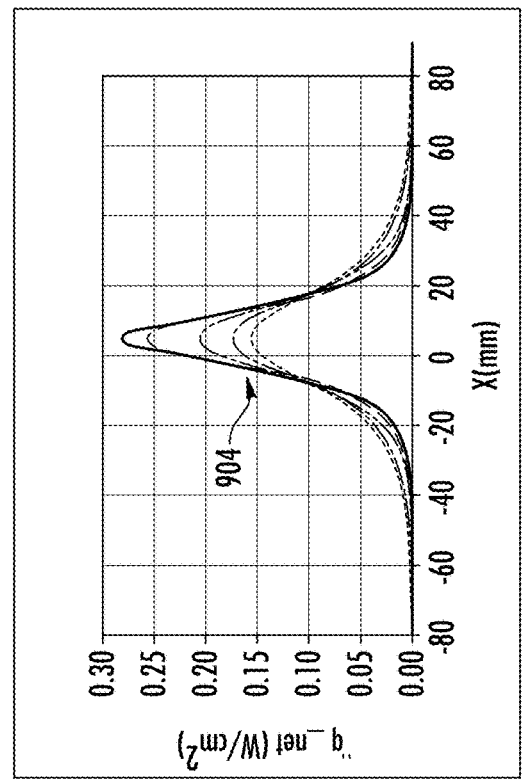
FIG. 9B depicts a series of segmented heater melt back response curves.
Figure 9A:
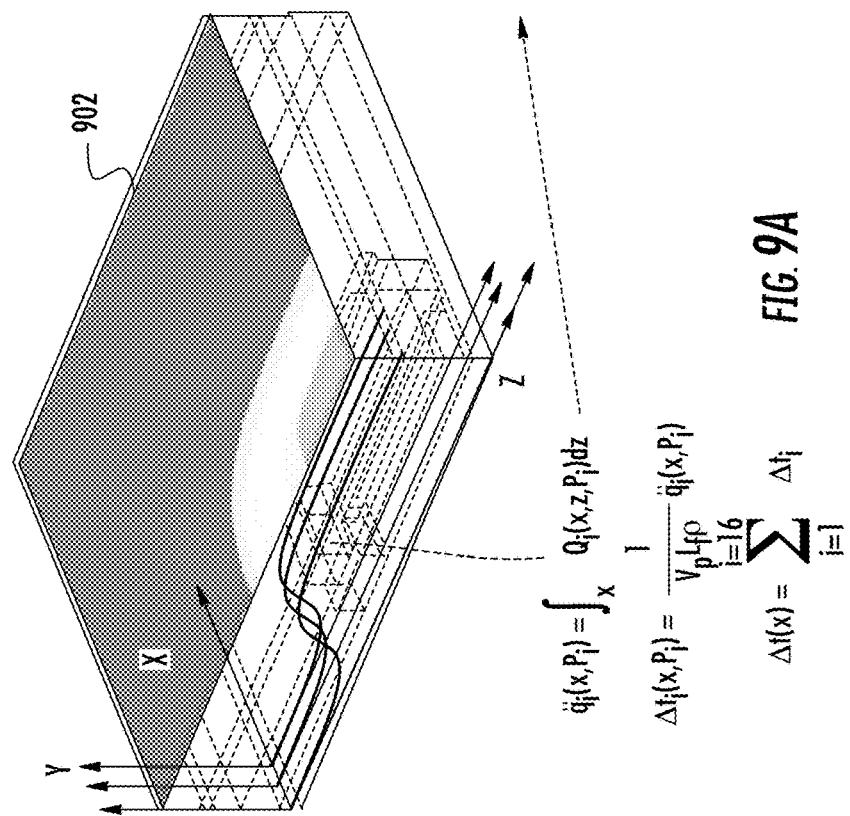
FIG. 9A shows a three dimensional model of heat flux including a layer consistent with an embodiment of the disclosure.

A computerized search may be performed for the optimized powers that produce the melt-back profile closest to the ideal form of the ribbon (thickness and uniformity). One example of this approach is shown graphically in FIGS. 9A and 9B. In FIG. 9A there is shown a three dimensional model of heat flux including a layer 902 representing heat flux at the top of a melt. FIG. 9B depicts a series of segmented heater melt back response curves 904. Each individual response curve of the melt back response curves 904 represents a heat flux profile that may be generated by a heating element of a segmented heater, where the heat flux profile is integrated over the length of the heating element along the Z-direction. By increasing power to an individual heating element, the shape of a response curve may be altered. The sum of all individual response curves for a plurality of heating elements in a segmented heater results in a heat flux profile for an entire segmented heater.

The present disclosure is not to be limited in scope by the specific embodiments described herein. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure. Furthermore, although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Thus, the claims set forth below should be construed in view of the full breadth and spirit of the present disclosure as described herein.

What is claimed is:

1. An apparatus for controlling thickness of a crystalline sheet grown from a melt, comprising:
   a crucible configured to contain the melt, the melt having an exposed surface that is separated from a floor of the crucible by a first distance;
   a housing comprising a material that is non-contaminating with respect to the melt, the housing comprising a plurality of sidewalls and a top that are configured to contact the melt;
   a plurality of heating elements isolated from the melt and disposed along a transverse direction that is perpendicular to a pulling direction of the crystalline sheet, the plurality of heating elements being individually powered,
   wherein the plurality of heating elements are disposed at a second set of distances with respect to the exposed surface of the melt that are less than the first distance, and wherein the plurality of heating elements are configured to vary a heat flux profile along the transverse direction when power is supplied individually to the plurality of heating elements;
   an insulator assembly disposed between adjacent heating elements and comprising a material that is configured to provide a first heat transfer rate; and
   a conductor assembly disposed between the plurality of heating elements and the top of the housing, and having a second heat transfer rate that is greater than the first heat transfer rate.

2. The apparatus of claim 1, wherein the plurality of heating elements are disposed at a constant distance from a surface of the melt along the transverse direction and along the pulling direction.

3. The apparatus of claim 1 further comprising:
   a cavity disposed between the heating elements and top of the housing,
   wherein the insulator assembly, conductor assembly and cavity are interoperative to generate a heat flux profile having a wiggle amplitude of less than 1% with respect to a total level of heat flux generated by the plurality of heating elements at the exposed surface.

4. The apparatus of claim 3, wherein the insulator assembly, conductor assembly and cavity are interoperative to generate a heat flux profile that varies heat flow along the transverse direction over a distance that is equal to one to three times a separation between adjacent heating elements.

5. The apparatus of claim 3, wherein the conductor assembly comprises a sawtooth cross-section along the transverse direction.

6. The apparatus of claim 1, further comprising a heater control system configured to direct power individually to the plurality of heating elements, wherein the heater control system is configured, responsive to a received thickness profile of the crystalline sheet along the transverse direction, to generate a heat flux profile that creates an adjusted thickness profile in the crystalline sheet that is more uniform than the received thickness profile.

7. The apparatus of claim 1, wherein the plurality of heating elements are elongated along the pulling direction.

8. The apparatus of claim 3, wherein the insulator assembly comprises a plurality of thermal barriers that are disposed between adjacent heating elements, wherein a top surface of the thermal barriers is recessed with respect to a top surface defined by the plurality of heating elements that is proximate the top of the housing.

9. The apparatus of claim 3, wherein the insulator assembly comprises a plurality of thermal barriers that are disposed between adjacent heating elements, wherein a first top surface of a pair of outer thermal barriers is disposed more closely to the top of the housing than a second top surface of inner thermal barriers disposed between the outer thermal barriers.

10. A system for growing a crystalline sheet from a melt, comprising:
   a crucible configured to contain the melt, the melt having an exposed surface that is separated from a floor of the crucible by a first distance;
   a crystallizer configured to generate a crystallization front of the crystalline sheet along a surface of the melt at a first position;
   a crystal puller configured to pull the crystalline sheet along a pull direction, wherein at a second position downstream of the crystallizer the crystalline sheet has an initial thickness profile along a transverse direction that is perpendicular to the pull direction; and
   a segmented heater downstream of the second position, the segmented heater comprising:

a housing;

a plurality of heating elements disposed along the transverse direction, wherein the housing is disposed between the plurality of heating elements and the melt, wherein the plurality of heating elements are disposed at a second set of distances with respect to the exposed surface of the melt that are less than the first distance, and wherein the plurality of heating elements are configured to vary a heat flux profile along the transverse direction so as to melt back the crystalline sheet to generate at a third position downstream of the second position, a final thickness profile along the transverse direction that is more uniform than the initial thickness profile;

an insulator assembly disposed between adjacent heating elements and comprising a material that is configured to provide a first heat transfer rate; and a conductor assembly disposed between the plurality of heating elements and the top of the housing, and having a second heat transfer rate that is greater than the first heat transfer rate.

11. The system of claim 10, further comprising a thickness control system comprising:

a thickness measurement system configured to measure a current thickness profile of the crystalline sheet along the transverse direction; and a heater control system configured to control power supplied to the plurality of heating elements to generate an adjusted heat flux profile that is effective to melt back the crystalline sheet to generate an adjusted thickness profile along the transverse direction that has improved thickness uniformity in comparison to that of the current thickness profile.

12. The system of claim 11 wherein the thickness measurement system comprises an ultrasonic thickness measurement system or a laser thickness monitor.

13. The system of claim 12, wherein the thickness measurement system comprises a first ultrasonic measurement system disposed upstream of the segmented heater and a second ultrasonic measurement system disposed downstream of the segmented heater.

14. The system of claim 11, wherein the heater control system comprises:

a plurality of power supplies configured to supply power individually to the plurality of heating elements, respectively; and a component to calculate the adjusted heat flux profile based upon the current thickness profile.

15. The system of claim 10, wherein the segmented heater further comprises:

a cavity disposed between the heating elements and top of the housing, wherein the insulator assembly, conductor assembly and cavity are interoperative to generate a heat flux profile having a wiggle amplitude of less than 1% with respect to a total level of heat flux generated by the segmented heater at the exposed surface.

16. The system of claim 15, wherein the insulator assembly and conductor assembly are configured to deliver a first heat flux density adjacent a pair of outer portions of the top of the housing that is greater than a second heat flux density adjacent an inner portion of the top of the housing that is disposed between the pair of outer portions.

17. The system of claim 10, wherein the plurality of heating elements are elongated along the pulling direction.

* * * * *